(12) United States Patent
Nishimura (10) Patent No.: US 10,649,326 B2
(45) Date of Patent: May 12, 2020

(54) PELLICLE FRAME AND A PELLICLE USING THE SAME

(71) Applicant: SHIN-ETSU CHEMICAL CO., LTD., Tokyo (JP)

(72) Inventor: Akinori Nishimura, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 229 days.

(21) Appl. No.: 15/851,847

(22) Filed: Dec. 22, 2017

(65) Prior Publication Data

US 2018/0180991 A1    Jun. 28, 2018

(30) Foreign Application Priority Data

Dec. 22, 2016   (JP) ................................ 2016-249199

(51) Int. Cl.
| | | |
|---|---|---|
| *G03F 1/64* | (2012.01) | |
| *G06F 1/00* | (2006.01) | |
| *G03F 1/00* | (2012.01) | |
| G06F 7/20 | (2006.01) | |
| G03F 7/20 | (2006.01) | |

(52) U.S. Cl.
CPC ............... *G03F 1/64* (2013.01); *G03F 1/142* (2013.01); *G03F 7/70983* (2013.01)

(58) Field of Classification Search
CPC .................................. G03F 1/64; G03F 1/142

USPC ............................................................. 430/5
See application file for complete search history.

(56) References Cited

U.S. PATENT DOCUMENTS 9,841,670 B2 * 12/2017 Kohmura .................. G03F 1/64

FOREIGN PATENT DOCUMENTS

| | | |
|---|---|---|
| JP | H6-45732 U | 6/1994 |
| JP | 2009-25562 A | 2/2009 |
| JP | 2011-007934 A | 1/2011 |
| JP | 2011-95593 A | 5/2011 |
| JP | 2016-090784 A | 5/2016 |
| WO | WO 2014/087905 A1 | 6/2014 |
| WO | WO 2016/072149 A1 | 5/2016 |

OTHER PUBLICATIONS

Office Action dated Oct. 24, 2019, in Japanese Patent Application No. 2016-249199 (w/ Computer-generated English translation).

* cited by examiner

*Primary Examiner* — Christopher G Young
(74) *Attorney, Agent, or Firm* — Oblon, McClelland, Maier & Neustadt, L.L.P.

(57) ABSTRACT

There is provided a pellicle frame and a pellicle using the frame, which has a hollow space inside a corner portion of the frame and optionally one or more hollow spaces in a straight portion (bar) of the frame, and also a hollow space in a corner portion of the frame may communicate with a neighboring hollow space in a straight portion of the frame.

20 Claims, 8 Drawing Sheets

PELLICLE FRAME AND A PELLICLE USING THE SAME

The present non-provisional patent application claims priority, as per Paris Convention, from Japanese Patent Application No. 2016-249199 filed on Dec. 22, 2016, the disclosure of which is hereby incorporated by reference herein in its entirety.

FIELD OF THE INVENTION

The present invention relates to a pellicle frame and a pellicle which includes the same pellicle frame.

BACKGROUND OF TECHNOLOGY

In the manufacture of semiconductor devices, liquid crystal displays and the like, patterns are formed by irradiating light onto a semiconductor wafer or a liquid crystal original plate on which resist is coated; however, if a foreign particle is attached to the photomask or the reticle (hereinafter simply referred to as a "photomask") used on these occasions, this foreign matter absorbs light or bends light, whereby the transferred pattern becomes deformed or the edges become coarse, and the base becomes dirty black with the resulting problems of impaired dimensions, quality, appearance and the like.

These lithography operations are usually performed in a clean room, but it is still difficult to keep the photomask constantly clean; therefore, light exposure is usually carried out after placing a pellicle as a dust fender over the surface of the photomask.

Such a pellicle is generally composed of a frame-shaped pellicle frame, a pellicle film stretched over the upper end face of the pellicle frame, an airtight gasket or the like formed on the lower end face of the pellicle frame. The pellicle film therein is made of a material exhibiting a high transmittance with respect to the exposure light, and a pressure sensitive adhesive or the like is used as the airtight gasket.

If such a pellicle is placed on a photomask, the foreign matter does not directly adhere to the photomask but adheres to the pellicle for they are intercepted by the pellicle. Then, in the photolithography step, if the focal point is aligned with the pattern of the photomask, the foreign matter on the pellicle is off the focal point and hence its image is not transferred, and thus the problems such as deformation of the pattern can be suppressed.

Now, in the photolithography technology, shortening of the wavelength of the exposure light source has been progressed as means for increasing the resolution. To date, the exposure light source has shifted from g-line (436 nm) and i-line (365 nm) by mercury lamp to KrF excimer laser (248 nm) and ArF excimer laser (193 nm), and furthermore, the use of EUV (Extreme Ultra Violet) light with a dominant wavelength of 13.5 nm is also being studied.

Of late, a problem has arisen in which when a pellicle is stuck on a photomask, distortion of the pellicle causes the photomask to be distorted similarly. This distortion is referred to as PID (Pellicle Induced Distortion) here. Due to this PID, the positional accuracy of the pattern to be formed in the photolithography step is impaired, which is a big problem in semiconductor device manufacturing.

As a means for reducing the distortion of the photomask caused as the pellicle is attached to it, IP Document 1 discloses a pellicle frame having a cross-sectional area of 6 $mm^2$ or smaller. Furthermore, IP Document 2 discloses a pellicle frame having a cross-section shaped like the letter I in order to reduce the sectional area while maintaining the width and height of the pellicle frame; likewise, IP Document 3 discloses a pellicle frame whose cross section has a plurality of hollow portions juxtaposed.

PRIOR ART PUBLICATIONS

IP Publications

[IP Publication 1] Japanese Patent Application Publication 2009-25562

[IP Publication 2] Japanese Patent Application Publication No. 2011-7934

[IP Publication 3] International Publication No. 2016/072149

SUMMARY OF THE INVENTION

Problems the Invention Seeks to Solve

These conventional pellicle frames were developed in consideration that the distortion of the pellicle frame is one cause of PID. That is, when a pellicle frame is attached to a photomask that has a greater flatness than the pellicle frame, the pellicle frame is flattened by the photomask, but at the same time, a stress (elastic force) trying to restore the original state is generated in the pellicle frame. Therefore, when an external force is removed from the assembly of the photomask and the pellicle, distortion occurs in the photomask influenced by the deformation of the pellicle frame; hence in order to lessen this stress created in the pellicle frame, efforts have been made to reduce the rigidity of the pellicle frame.

However, although the pellicle frame having the cross-section shaped like the letter I of IP Document 2 has an effect of suppressing the PID, it gives rise to a problem that the surface area of the pellicle frame becomes so large that the range for inspection for foreign particles is extraordinarily expanded and the lowering of the working efficiency caused thereby becomes unacceptable.

In addition, when the present inventor fabricated a pellicle frame according to an embodiment described in IP Document 3 and measured the PID, it was found that, although a certain degree of PID suppression effect was obtained, its suppressing effect was limited.

Accordingly, the present invention has been made in view of the above circumstances, and an object thereof is to provide a pellicle frame exhibiting a high PID suppressing effect and a pellicle using the same.

Means for Solving the Problem

The inventor of the present invention has made intensive studies to solve the above problems, and as a result, he came to realize that the PID has a correlation with the sectional secondary moment of inertia about the x axis of the pellicle frame (with respect to the force in the height direction) and that the PID tends to decrease as the sectional secondary moment of inertia of the pellicle frame is material-dynamically decreased.

On the other hand, the present inventor has also found that when a normal pellicle is stuck to a photomask, a substantial shape change tends to occur near each corner of the pellicle, and he thought this indicates that a large stress is created at the corners on this occasion; therefore, in addition to reducing the sectional secondary moment of inertia of the pellicle frame, further investigation was made in terms of shape and structure in order to further improve the PID suppression effect, and eventually, a hollow portion was provided inside the corner portion of the pellicle frame, and it was found that, as the result of this, a higher PID suppressing effect was obtained-consequently the inventor possessed the present invention.

Means to Solve the Problems

Consequently, the pellicle frame of the present invention is a polygonally framed or many-sided pellicle frame (that is, the frame has at least three frame bars) and is characterized in that a hollow portion is formed inside corner portion of the pellicle frame. Further, in the pellicle frame of the present invention, a hollow portion may also be formed inside a straight portion (bar) of the pellicle frame, and it is preferable that a hollow portion formed inside the corner portion of the pellicle frame and a hollow portion formed inside the straight portion communicate with each other. Further, in the pellicle frame of the present invention, it is preferable that the cross-sectional area, as cut vertically to the central line of the frame bar, of the hollow portion formed inside the corner portion of the pellicle frame is larger than the cross-sectional area of the hollow portion formed inside the straight portion.

Further, the pellicle frame of the present invention is a pellicle frame having a hollow portion formed therein, and has an optional through hole extending from a hollow portion to the surface of the pellicle frame. In addition, the pellicle frame of the present invention is optionally formed by joining two polygonal frame-like members (polygonally framed sub-frames) face-to-face, and the hollow portion preferably consists of a groove provided in a joining surface of one or both of the frame-like members.

Optionally, the pellicle frame of the present invention is a polygonally framed pellicle frame, wherein the secondary moment of area (sectional secondary moment of inertia) in the corner portion of the pellicle frame is smaller than the secondary moment of area in the straight portion. The secondary moment of area in the corner portion of the pellicle frame is preferably 85% or more but less than 100% of the second moment of area in the straight portion.

The pellicle frame of the present invention is provided for manufacturing a pellicle for photolithography.

Effect of the Invention

According to the pellicle frame of the present invention, as compared with the conventional pellicle frame, it is possible to effectively suppress the PID when the pellicle produced by using the pellicle frame is attached to the photomask. Therefore, it can be effectively used even in a finer pattern forming process.

EMBODIMENTS FOR CARRYING OUT THE INVENTION

Hereinafter, one embodiment of the present invention will be described in detail, but the present invention is not limited thereto.

The pellicle frame and the pellicle of the present invention are suitable for use in semiconductor manufacturing, in which the distortion of the photomask is particularly problematic; but their application is not particularly limited thereto. For example, the pellicle of the present invention can be applied as a semiconductor manufacturing pellicle having a frame bar size of about 150 mm, a printed circuit board manufacturing pellicle having a frame bar size of 200 to 300 mm, or a liquid crystal display or an organic EL display manufacturing pellicle having a frame bar size of 500 to 2000 mm.

Figure 1:
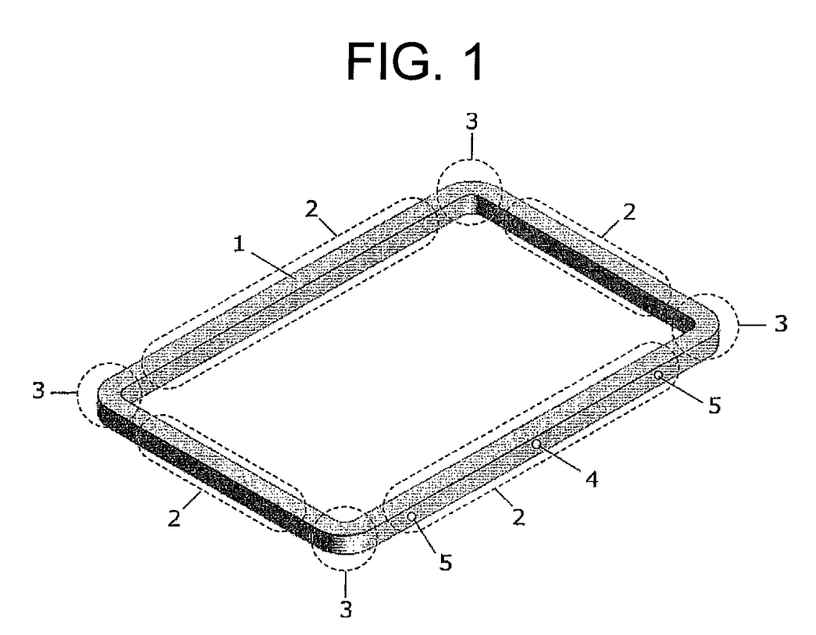
FIG. 1 is a schematic perspective view of a pellicle frame of the present invention.

The pellicle frame of the present invention has a polygonal frame shape and has corner portions. In general, it has a rectangular frame shape as shown in FIG. 1. The corner portion 3 at which linear portions 2 intersect may be rounded, and a ventilation hole (through hole) 4 and a jig hole 5 may be provided.

Figure 2:
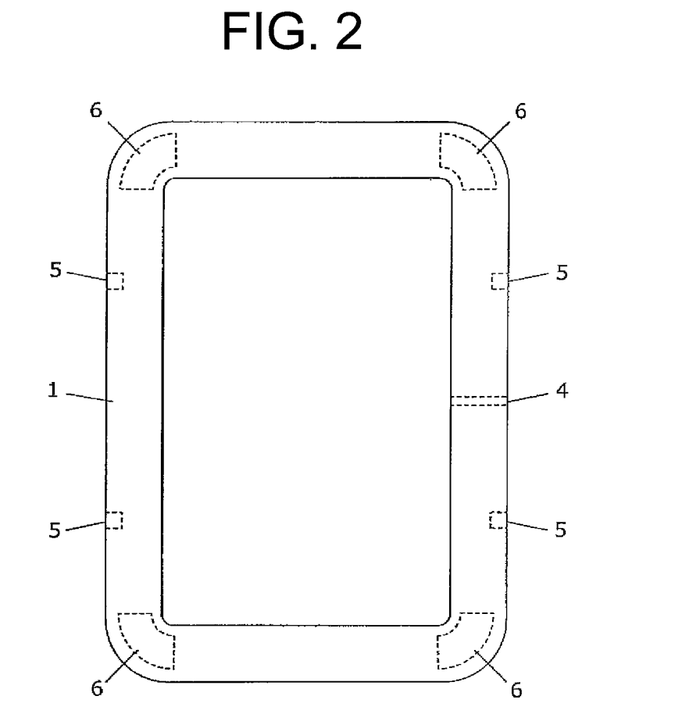
FIG. 2 is a schematic plan view of a pellicle frame structure in which a hollow portion is formed at each corner portion of the pellicle frame of the present invention.

Inside a corner portion 3 of the pellicle frame, a hollow portion 6 is formed as shown in FIG. 2. By virtue of this, when the pellicle is stuck to the photomask, it is possible to effectively reduce a substantial shape change that occurs in the vicinities of a pellicle corner portion, and as a result, PID can be suppressed.

Further, the pellicle frame of the present invention may be constructed by joining two congruent polygonally framed members face-to-face. It is possible to provide a groove in the joining face of one of the two polygonally framed members and join it with the other polygonally framed member without a groove to thereby form a pellicle frame, whereby the groove becomes the hollow portion of the pellicle frame. Further, it is also possible to provide a groove in each of two congruent polygonally framed members and then join the two members together to thereby form a pellicle frame, whereby the respective grooves combine to form a hollow portion.

The method of joining the two congruent polygonally framed members is not particularly limited, and it may be selected appropriately based on the material to be used; in particular if a metal, an alloy or the like is used as a material of the frame-like members, it is preferable to join them by solid phase bonding. By using the solid phase bonding, it is possible to precisely join the two members, and it is also possible to prevent the strength of the resultant pellicle frame from lowering. To achieve the solid phase bonding, one can adopt a vapor deposition using a focused ion beam, diffusion bonding, friction diffusion bonding, or the like.

Further, in the pellicle frame of the present invention, it was found that by forming the hollow portion inside the pellicle frame, it is possible to reduce the secondary moment of area Ix around the x axis (with respect to the force in the height direction). In fact, as compared with the conventional configuration in which the cross sectional secondary moment of inertia Ix is reduced through reduction of the cross-sectional area of the pellicle frame, for example, by making it like the letter I, the pellicle frame in which a hollow portion 6 is formed inside the corner portion 3 can make PID still smaller.

Figure 3:
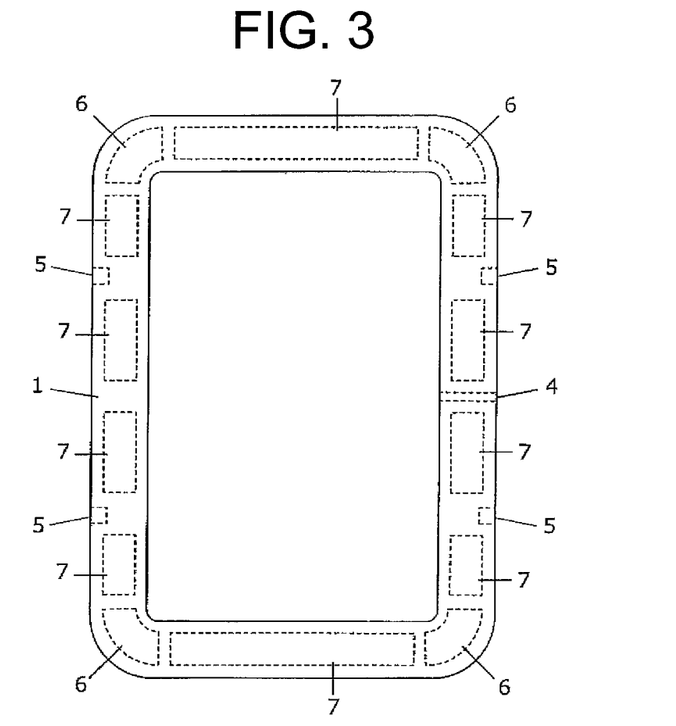
FIG. 3 is a schematic plan view of a pellicle frame structure in which a hollow portion is formed in a corner portion as well as a straight portion of the pellicle frame of the present invention.
Figure 4:
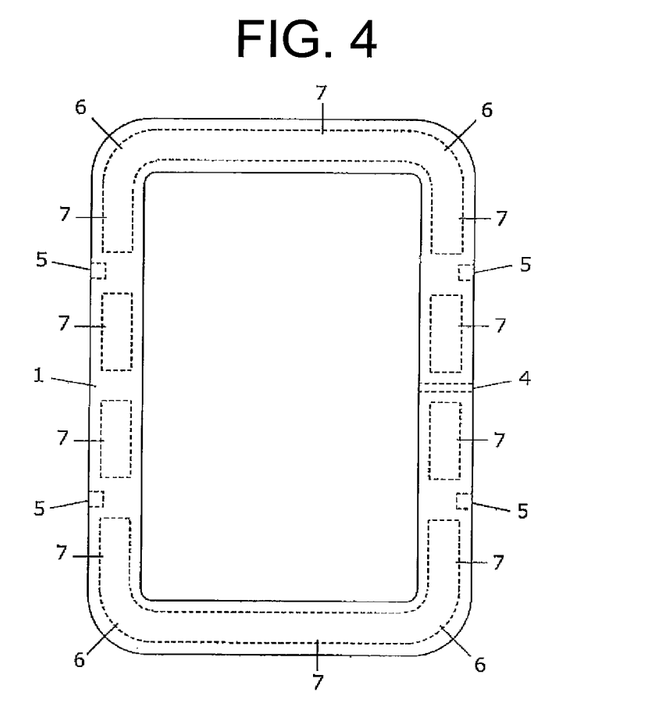
FIG. 4 is a schematic plan view of a pellicle frame structure of the present invention in which a hollow portion of a corner portion and a hollow portion of a straight portion are communicated with each other.

In the pellicle frame of the present invention it is preferable to form the hollow portion 7 also inside the straight portion 2 of the pellicle frame, as shown in FIG. 3, whereby further PID suppression effect can be obtained. Further, as shown in FIG. 4, the hollow portion 6 formed inside the corner portion of the pellicle frame and the hollow portion 7 formed inside the straight portion of the pellicle frame may communicate with each other. At the same time as this, it is preferable that a hollow portion is formed at all locations except for where a ventilation hole 4 and/or a jig hole 5 are provided and the vicinities thereof. For example, a hollow portion may be formed at a position not within 10 mm from the center of the ventilation hole 4 and/or the jig hole 5.

Further, all the hollow portions inside the pellicle frame may be communicated with its neighboring ones so that a single hollow portion is formed to go round the pellicle frame endlessly. In this case, the ventilation hole 4 and/or the jig hole 5 may be provided offset from the hollow portion in the height direction, or it is also possible to constrict that part of the hollow portion where the ventilation hole 4 and/or the jig hole 5 is provided so as to allow sufficient space for those holes.

The hollow portion may be closed from the external space or may communicate with the external space through a hole extending from the hollow portion to the pellicle frame surface. If the hollow portion is closed from the external space, it is possible to prevent entry of foreign matter into the hollow portion and generation of foreign matter from the hollow portion.

However, with the hollow portion closed, there occurs a problem with respect to the gas (air) entrapped in the hollow portion. In particular, due to expansion of the gas in the hollow portion caused by temperature change and/or external pressure change, an external stress may be created from the hollow portion and imparted to the pellicle frame to thereby distort the latter. This problem is especially critical in the EUV exposure operation, where the pellicle is used under a vacuum condition and the pellicle frame is supposed to acquire a high temperature. However, if the hollow portion is open to the external space via a through hole, such distortion problem can be avoided. This through hole from the hollow portion to the pellicle frame surface may also be designed to have a function as a ventilation hole or a jig hole.

Although the size of the hollow portion of the present invention is not particularly limited, if the hollow portion is too small, the PID suppression effect cannot be obtained, while if it is too large, although the PID suppression effect may increase, the strength of the pellicle frame becomes so small that handling of the pellicle frame becomes difficult.

Figure 5:
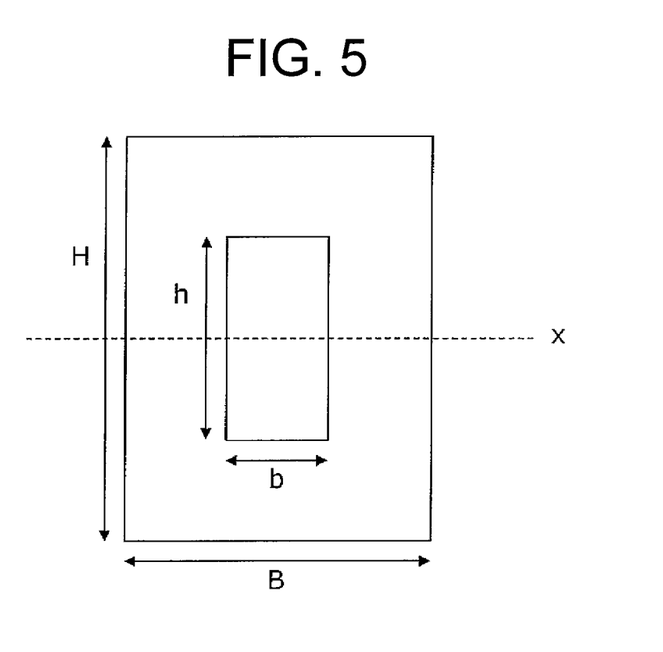
FIG. 5 is a schematic cross-sectional view showing a cross-section of a hollow portion of a pellicle frame of the present invention.

As described above, from the viewpoint of shape and structure, the pellicle frame of the present invention is effective for suppressing PID by forming a hollow portion in the corner portion of the pellicle frame. On the other hand, from the viewpoint of material dynamics, it is possible to suppress the PID by reducing the moment of inertia Ix of the corner portion and the straight portion of the pellicle frame. In the case of a pellicle frame having a hollow section whose cross section is as shown in FIG. 5, its sectional secondary moment of inertia Ix is expressed by the following equation.

$$Ix = \frac{BH^3 - bh^3}{12}$$

wherein B is the width of the pellicle frame, H is the height of the pellicle frame, b is the width of the hollow portion, and h is the height of the hollow portion.

Therefore, in the case of a pellicle frame having a hollow portion formed therein, according to the above equation, it is possible to effectively reduce the sectional secondary moment of inertia Ix by increasing the height h of the hollow portion of the pellicle frame. Specifically, the height h of the hollow portion is preferably 50 to 80% of the height H of the pellicle frame.

In addition, since the width b of the hollow portion does not influence the sectional secondary moment of inertia Ix as much as the height h, and since it is preferable that the bending rigidity against the force in the width-wise direction of the pellicle frame is large, the width b of the hollow portion is preferably smaller than the height h. Specifically, the width b of the hollow portion is preferably 35 to 50% of the width B of the pellicle frame.

Further, the cross-sectional area of the hollow portion is preferably 17.5 to 40% of the cross-sectional area of the pellicle frame (including the cross-sectional area of the hollow portion). The size or the shape of the hollow part may be uniform at all places, or may be partially changed; in particular, the cross-sectional area of the hollow portion formed inside the corner portion is preferably larger than the cross-sectional area of the hollow portion formed inside the straight portion. By virtue of this arrangement, it becomes possible to render the stress generated when the pellicle is stuck to the photomask such that the magnitude of the stress generated at the corner portion becomes nearly equal to that generated at the linear portion of the pellicle frame, whereby it is possible to suppress the PID most effectively.

In addition, the bending rigidity of the pellicle frame is considered to be correlated with the sectional secondary moment of inertia according to material dynamics, so that in the case of a pellicle frame in which a hollow portion is formed, the sectional secondary moment of inertia at the corner portion of the pellicle frame is preferably smaller than that at the straight portion thereof, and in particular it is preferred that the sectional secondary moment of inertia at the corner portion is 85% or greater but less than 100% of that at the straight portion. If the percentage is less than 85%, then the magnitude of the stress created at the corner portion when the pellicle is adhered to the photomask becomes substantially different from that created at the straight portion of the pellicle frame, whereby the PID tends to be significantly large.

Incidentally, in the present invention, in the case where the corner portion of the pellicle frame is rounded, as in FIG. 2, the corner portion refers to a range which lies between the outer rounded periphery and the inner rounded periphery, and the other portion is considered to belong to the straight portion of the pellicle frame. Also, when the cross-sectional shape, the cross-sectional area, or the sectional secondary moment of inertia are not respectively uniform at a portion, the average value of each shall be taken as the value at the corner portion and/or the straight portion.

The material of the pellicle frame is not particularly limited, and any known material can be used. Examples are metals and alloys such as aluminum, aluminum alloy, steel, stainless steel, brass, invar, and super invar, engineering plastics such as polyethylene (PE) resin, polyamide (PA) resin, and polyether.ether.ketone (PEEK) resin, fiber composite materials such as glass fiber reinforced plastic (GFRP) and carbon fiber reinforced plastic (CFRP).

It is preferable that the surface of the pellicle frame is treated so as to be black, and if necessary a layer such as coating is applied to the surface for prevention of dust generation from the surface. For example, when the pellicle frame is made of an aluminum alloy, a surface treatment such as alumite treatment or a chemical conversion treatment is preferably performed, and if it is made of a steel, stainless steel or the like, a surface treatment such as black chromium plating is preferably performed.

On the inner peripheral surface of the pellicle frame, it is preferable also to apply an adhesive substance such as an acrylic adhesive, a silicone adhesive or the like in order to capture and fix floating foreign matters. It is also preferable to form a coating film of a non-tacky resin such as an acrylic resin and a fluorine resin on the inner peripheral surface of the pellicle frame or the entire surface thereof for the purpose of preventing dust generation. The formation of the film layer of these tacky resin or non-tacky resin can be carried out by a known method such as spraying, dipping, powder coating, and electrodeposition coating.

A plurality of jig holes or grooves may be provided on the outer peripheral face of the pellicle frame for purposes such as handling. Furthermore, marking of model number, serial number, bar code, etc. may be provided by mechanical engraving or laser burning.

Furthermore, it is preferable to provide a ventilation hole for air pressure adjustment of the space which is created between the pellicle and the photomask when they are attached to each other. It is also preferable to install a filter made of a porous material such as polytetrafluoroethylene (PTFE) or the like in order to prevent foreign matter from entering through the ventilation hole. This filter can be installed by a method such as bonding it to the outer peripheral face of the pellicle frame via an adhesive. This filter can be installed by a method such as bonding it to the outer peripheral face of the pellicle frame via an adhesive. Further, the shape, position and number of ventilation holes and filters may be determined in consideration of required air permeability and handling details to be performed.

A pellicle can be fabricated from the pellicle frame of the present invention by providing the frame with a pellicle film, a pressure sensitive adhesive layer, etc. The material for the pellicle film can be selected from appropriate materials such as cellulose resin and fluorine resin, depending on the exposure light source to be used. Further, the film thickness may be appropriately designed from the viewpoints of transmittance, mechanical strength, etc., and an antireflection layer may be provided if necessary. In particular, when EUV light is used as the exposure light source, an extremely thin silicon film or graphene film having a thickness of 1 µm or less can be used. Furthermore, the pellicle film can be adhered tensely to the upper end face of the pellicle frame via a known adhesive such as an acrylic adhesive, a fluorine adhesive, and a silicone adhesive.

An agglutinant layer for mounting the pellicle on the photomask is provided on the lower end face of the pellicle frame. Examples of the materials useful to make the agglutinant layer are known materials such as a rubber type pressure sensitive adhesive, a urethane type pressure sensitive adhesive, an acrylic pressure sensitive adhesive, a styrene.ethylene.butylene.styrene (SEBS) pressure sensitive adhesive, a styrene.ethylene.propylene.styrene (SEPS) pressure sensitive adhesive, and a silicone pressure sensitive adhesive. It is preferable that the agglutinant material is a kind that releases less outgas, which causes haze.

In order to secure the stability after mounting the pellicle on the photomask and to reduce the physical influence imparted to the photomask, the flatness of the surface of the agglutinant layer is preferably 30 µm or less. Further, the cross-sectional shape and the thickness of the agglutinant layer may be determined as required, and for example, its cross-sectional shape may be a convex shape such as semi-circular.

It is acceptable to provide on the exposed face of the agglutinant layer a separator made of PET film or the like having releasing ability on one side thereof, and having a thickness of about 50 to 300 µm. This film is for protecting the agglutinant layer and may be omitted if the pellicle case, the pellicle support means or the like is devised to protect the agglutinant layer.

EXAMPLES

Hereinafter, the present invention will be described in detail with reference to examples and comparative examples.

Example 1

In Example 1, first a rectangular-shaped pellicle frame made of an aluminum alloy was prepared. In this pellicle frame 1, hollow portions 6 and 7 were formed as shown in FIG. 4. The outer dimension of the pellicle frame 1 was 149 mm×115 mm×3.15 mm, and the frame width was 1.95 mm.

Further, the cross section of a portion where a hollow portion was formed was as shown in FIG. 5, wherein B=1.95 mm, H=3.15 mm, b=0.70 mm, and h=2.30 mm. In this case, the sectional secondary moment of inertia Ix was 4.37 mm$^4$.

The height of the hollow portion h was 73% of the height of the pellicle frame H, and the width of the hollow portion b was 36% of the width of the pellicle frame B. The cross-sectional area of the hollow portion was 26% of the cross-sectional area of the pellicle frame (including the cross-sectional area of the hollow portion). The magnitude of the sectional secondary moment of inertia at the corner portion of the pellicle frame was 100% of that of the sectional secondary moment of inertia at the straight portion.

Further, in the pellicle frame 1, a ventilation hole of ϕ 0.5 mm (diameter) and four jig holes 5 of ϕ 1.6 mm and 1.3 mm depth were formed. Incidentally, the hollow portions were provided at positions at least 5 mm away from the center of the ventilation hole and that of the jig hole. In addition, this pellicle frame 1 was fabricated by combining two congruent sub-frames via solid-phase joining, each sub-frame having grooves to form the hollow portions.

Next, after washing the thus prepared pellicle frame 1 with pure water, a silicone adhesive (KE-101 A/B manufactured by Shin-Etsu Chemical Co., Ltd.) was applied to the upper end face of the pellicle frame 1, and an acrylic adhesive (SK Dyne 1495 manufactured by Soken Chemical & Engineering Co., Ltd.) was applied to the lower end face of the pellicle frame 1 as the agglutinant layer.

Subsequently, a pellicle film made of monocrystalline silicon supported by a sheet of a meshed member was attached to the upper end face of the pellicle frame, and the pellicle film and the meshed member protruding outside of the pellicle frame were trimmed off, thereby completing the pellicle.

The thus prepared pellicle was affixed to a 150-mm square photomask substrate with the lower end face of the pellicle frame meeting the photomask substrate, and the PID was evaluated; the PID value was 24 nm.

The details for the manner of attaching the pellicle to the photomask were a load of 5 kgf and a loading time of 30 seconds. The evaluation of PID was conducted using Flat-Master manufactured by Corning Tropel, and accordingly, the maximum amount of distortion that took place in a positive direction vertical to a hypothetical plane of the photomask during the course of the attaching operation was added to the maximum amount of distortion that took place in a negative direction vertical to the hypothetical plane of the photomask substrate during the course of the attaching operation and the sum was used as the value (magnitude) of PID.

Example 2

In Example 2, first a rectangular-shaped pellicle frame made of an aluminum alloy was prepared. In this pellicle frame 1, hollow portions 6 were formed one at each one of four corners, as shown in FIG. 2. The outer dimension of the pellicle frame 1 was 149 mm×115 mm×3.15 mm, and the frame width was 1.95 mm.

Further, the cross section of a portion where a hollow portion was formed is as shown in FIG. 5, wherein B=1.95 mm, H=3.15 mm, b=0.70 mm, and h=2.30 mm. In this case, the sectional secondary moment of inertia Ix was 4.37 mm$^4$.

The height of the hollow portion h was 73% of the height of the pellicle frame H, and the width of the hollow portion b was 36% of the width of the pellicle frame B. The cross-sectional area of the hollow portion was 26% of the cross-sectional area of the pellicle frame (including the cross-sectional area of the hollow portion). The magnitude of the sectional secondary moment of inertia at the corner portion of the pellicle frame was 86% of that of the sectional secondary moment of inertia at the straight portion.

Further, in the pellicle frame 1, a ventilation hole of $\phi$ 0.5 mm and four jig holes 5 of $\phi$ 1.6 mm and 1.3 mm depth were formed. Incidentally, the hollow portions were provided at positions at least 5 mm away from the center of the ventilation hole and that of the jig hole. In addition, this pellicle frame 1 was fabricated by combining two congruent sub-frames via solid-phase joining, one of the sub-frames having grooves to form the hollow portions.

Next, after washing the thus prepared pellicle frame 1 with pure water, a silicone adhesive (KE-101 A/B manufactured by Shin-Etsu Chemical Co., Ltd.) was applied to the upper end face of the pellicle frame 1, and an acrylic adhesive (SK Dyne 1495 manufactured by Soken Chemical & Engineering Co., Ltd.) was applied to the lower end face of the pellicle frame 1 to form the agglutinant layer.

Subsequently, a pellicle film made of monocrystalline silicon supported by a sheet of a meshed member was attached to the upper end face of the pellicle frame, and the pellicle film and the meshed member protruding outside of the pellicle frame were trimmed off, thereby completing the pellicle.

The thus prepared pellicle was affixed to a 150-mm square photomask substrate in the same manner as in Example 1 and the PID was evaluated; the PID value was 27 nm.

Examples 3 Through 6

Figure 6:
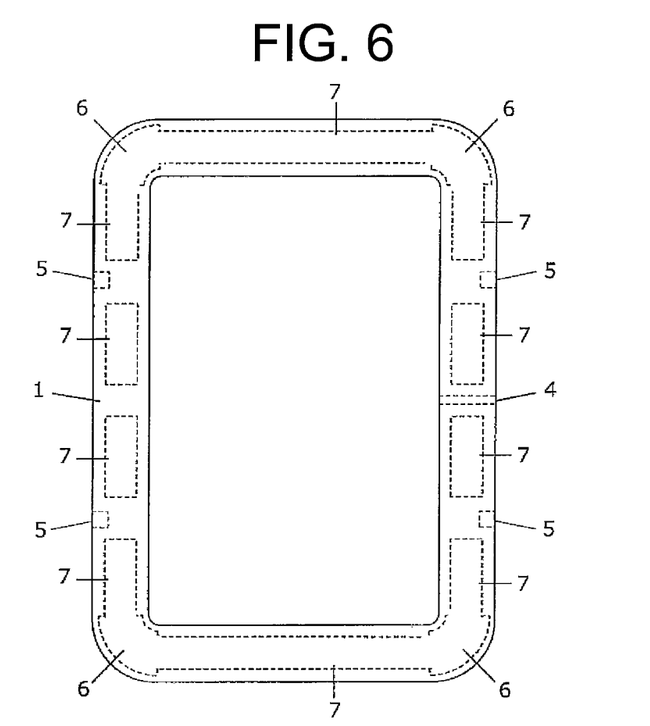
FIG. 6 is a schematic plan view of a pellicle frame structure of the present invention in which a hollow portion of a corner portion and a hollow portion of a straight portion are communicated with each other.

In each of Examples 3 through 6, a rectangular-shaped pellicle frame made of an aluminum alloy was prepared. In each pellicle frame 1, hollow portions 6 and 7 were formed, as shown in FIG. 6. Here, the cross-sectional area of the hollow portion was not necessarily identical between the straight portion and the corner portion of the frame. In the case of FIG. 6, the cross-sectional area of the hollow portion at a corner portion was greater than that of the hollow portion at a straight portion of the frame.

Also, the outer dimension of the pellicle frame 1 was 149 mm×115 mm×3.15 mm, and the frame width was 1.95 mm. Further, the cross section of a portion where a hollow portion was formed is as shown in FIG. 5, and the dimension of the hollow portions and the sectional secondary moment of inertia Ix were designed to be the magnitudes as shown in Table 1.

Further, in each of these pellicle frames, a ventilation hole of $\phi$ 0.5 mm and four jig holes of $\phi$ 1.6 mm and 1.3 mm depth were formed. Incidentally, the hollow portions were provided at positions at least 5 mm away from the center of the ventilation hole and those of the jig holes. In addition, each pellicle frame was fabricated by combining two congruent sub-frames via solid-phase joining, one or both of the sub-frames having grooves to form the hollow portions.

Next, after washing the thus prepared pellicle frames with pure water, a silicone adhesive (KE-101 A/B manufactured by Shin-Etsu Chemical Co., Ltd.) was applied to the upper end face of each pellicle frame, and an acrylic adhesive (SK Dyne 1495 manufactured by Soken Chemical & Engineering Co., Ltd.) was applied to the lower end face of each pellicle frame as the agglutinant layer.

Subsequently, a pellicle film made of monocrystalline silicon supported by a sheet of a meshed member was attached to the upper end face of each pellicle frame, and the pellicle film and the meshed member protruding outside of the pellicle frame were trimmed off, thereby completing the pellicles.

The thus prepared pellicles were affixed to a 150-mm square photomask substrate in the same manner as in Example 1 and the PID's were evaluated; the results are as shown in Table 1.

TABLE 1

| | | | Example 1 | Example 2 | Example 3 | Example 4 | Example 5 | Example 6 | Comparative Example 1 | Comparative Example 2 | Comparative Example 3 |
|---|---|---|---|---|---|---|---|---|---|---|---|
| outer dimension | | width B [mm] | 1.95 | 1.95 | 1.95 | 1.95 | 1.95 | 1.95 | 1.95 | 1.95 | 1.95 |
| | | height H [mm] | 3.15 | 3.15 | 3.15 | 3.15 | 3.15 | 3.15 | 3.15 | 3.15 | 3.15 |
| | | cross-sectional area [mm$^2$] | 6.14 | 6.14 | 6.14 | 6.14 | 6.14 | 6.14 | 6.14 | 6.14 | 3.14 |
| straight portion | dimension of hollow protion | width b [mm] | 0.70 | — | 0.70 | 0.70 | 0.70 | 0.70 | — | 0.70 | 1.50 |
| | | with ratio [%] | 36 | — | 36 | 36 | 36 | 36 | — | 36 | — |
| | | height h [mm] | 2.30 | — | 2.30 | 2.30 | 2.30 | 2.30 | — | 2.30 | 2.00 |

TABLE 1-continued

|  |  |  | Example 1 | Example 2 | Example 3 | Example 4 | Example 5 | Example 6 | Comparative Example 1 | Comparative Example 2 | Comparative Example 3 |
|---|---|---|---|---|---|---|---|---|---|---|---|
|  |  | height ratio [%] | 73 | — | 73 | 73 | 73 | 73 | — | 73 | — |
|  |  | cross-sectional area [mm$^2$] | 1.61 | — | 1.61 | 1.61 | 1.61 | 1.61 | — | 1.61 | — |
|  |  | cross-sectional ratio [%] | 26 | — | 26 | 26 | 26 | 26 | — | 26 | — |
|  |  | sectional secondary moment of inertia I x [mm$^4$] | 4.37 | 5.08 | 4.37 | 4.37 | 4.37 | 4.37 | 5.08 | 4.37 | 4.08 |
| corner portion | dimension of hollow portion | width b [mm] | 0.70 | 0.70 | 0.60 | 0.80 | 0.90 | 1.00 | — | — | 1.50 |
|  |  | with ratio [%] | 36 | 36 | 31 | 41 | 46 | 51 | — | — | — |
|  |  | height h [mm] | 2.30 | 2.30 | 2.20 | 2.40 | 2.50 | 2.60 | — | — | 2.00 |
|  |  | height ratio [%] | 73 | 73 | 70 | 76 | 79 | 83 | — | — | — |
|  |  | cross-sectional area [mm$^2$] | 1.61 | 1.61 | 1.32 | 1.92 | 2.25 | 2.60 | — | — | — |
|  |  | cross-sectional ratio [%] | 26 | 26 | 21 | 31 | 37 | 42 | — | — | — |
|  |  | sectional secondary moment of inertia I x [mm$^4$] | 4.37 | 4.37 | 4.55 | 4.16 | 3.91 | 3.61 | 5.08 | 5.08 | 4.08 |
| (I x at corner portion) × 100 Ix at straight portion [%] |  |  | 100 | 86 | 104 | 95 | 89 | 83 | 100 | 116.00 | 100.00 |
| PID [nm] |  |  | 24 | 27 | 26 | 22 | 21 | 25 | 37 | 30 | 26 |

Comparative Example 1

First, in Comparative Example 1, a rectangular-shaped pellicle frame made of an aluminum alloy was prepared. The outer dimension of the pellicle frame was 149 mm×115 mm×3.15 mm, and the frame width was 1.95 mm. Unlike the Examples of the present invention a hollow portion was not formed in this pellicle frame (not shown). Therefore, the sectional secondary moment of inertia Ix was 5.08 mm$^4$. In addition, in this pellicle frame, four ventilation holes of ϕ 0.5 mm and four jig holes of ϕ 1.6 mm and 1.3 mm depth were formed.

Next, after washing the thus prepared pellicle frame with pure water, a silicone adhesive (KE-101 A/B manufactured by Shin-Etsu Chemical Co., Ltd.) was applied to the upper end face of the pellicle frame, and an acrylic adhesive (SK Dyne 1495 manufactured by Soken Chemical & Engineering Co., Ltd.) was applied to the lower end face of the pellicle frame as the agglutinant layer.

Subsequently, a pellicle film made of monocrystalline silicon supported by a sheet of a meshed member was attached to the upper end face of the pellicle frame, and the pellicle film and the meshed member protruding outside of the pellicle frame were trimmed off, thereby completing the pellicle.

The thus manufactured pellicle was coupled with a 150-mm square photomask substrate in the same manner as in Example 1, and the PID was evaluated, and it was 37 nm, which was larger than the values in the cases of Examples 1 through 6.

Comparative Example 2

Figure 7:
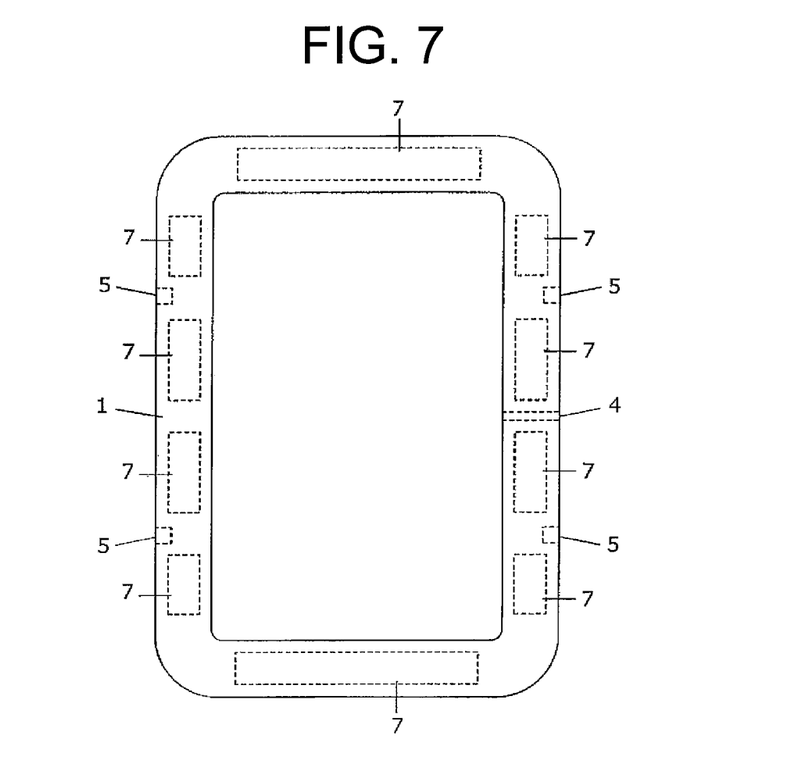
FIG. 7 is a schematic plan view of a pellicle frame structure of Comparative Example 2.

First, in Comparative Example 2, a rectangular-shaped pellicle frame made of an aluminum alloy was prepared. As shown in FIG. 7, although hollow portions 7 were formed in this pellicle frame, no hollow portion 6 was formed at the corner portions. The outer dimension of the pellicle frame was 149 mm×115 mm×3.15 mm, and the frame width was 1.95 mm.

The shape of the cross section of the pellicle frame bar wherein a hollow portion 7 was formed was one as shown in FIG. 5, in which B=1.95 mm, H=3.15 mm, b=0.70 mm, and h=2.30 mm. In this case, the sectional secondary moment of inertia Ix was 4.37 mm$^4$.

The height of the hollow portion was 73% of the height of the pellicle frame, and the width of the hollow portion was 36% of the width of the pellicle frame. The cross-sectional area of the hollow portion 7 was 26% of the cross-sectional area of the pellicle frame (including the cross-sectional area of the hollow portion). The magnitude of the sectional secondary moment of inertia at the corner portion of the pellicle frame was 116% of that of the sectional secondary moment of inertia at the straight portion.

Further, in this pellicle frame, a ventilation hole of ϕ 0.5 mm (diameter) and four jig holes 5 of ϕ 1.6 mm and 1.3 mm depth were formed. Incidentally, the hollow portions 7 were provided at positions at least 5 mm away from the center of the ventilation hole and that of the jig hole. In addition, this pellicle frame was fabricated by combining two congruent sub-frames via solid-phase joining, each sub-frame having grooves to form the hollow portions.

Next, after washing the thus prepared pellicle frame with pure water, a silicone adhesive (KE-101 A/B manufactured by Shin-Etsu Chemical Co., Ltd.) was applied to the upper end face of the pellicle frame 1, and an acrylic adhesive (SK Dyne 1495 manufactured by Soken Chemical & Engineering Co., Ltd.) was applied to the lower end face of the pellicle frame 1 as the agglutinant layer.

Subsequently, a pellicle film made of monocrystalline silicon supported by a sheet of a meshed member was attached to the upper end face of the pellicle frame, and the pellicle film and the meshed member protruding outside of the pellicle frame were trimmed off, thereby completing the pellicle.

The thus manufactured pellicle was coupled with a 150-mm square photomask substrate in the same manner as in Example 1, and the PID was evaluated and it was 30 nm, which is larger than the values in the cases of Examples 1 through 6.

Comparative Example 3

Figure 8:
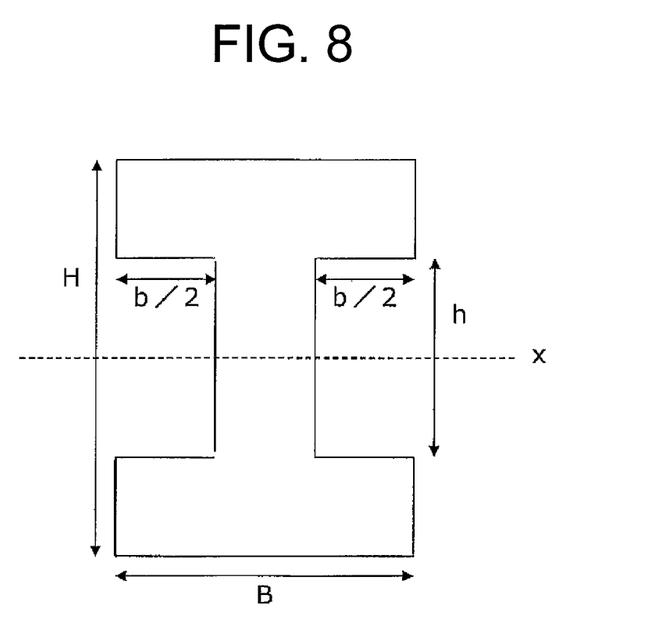
FIG. 8 is a schematic cross-sectional view of a pellicle frame structure of Comparative Example 3.

First, in Comparative Example 3, a rectangular-shaped pellicle frame made of an aluminum alloy was prepared. This pellicle frame has a cross section shaped like a letter I, as shown in FIG. 8, except for the portion where a ventilation hole or a jig hole was formed. The outer dimension of the pellicle frame was 149 mm×115 mm×3.15 mm, and the frame width was 1.95 mm. Here, the magnitude of the sectional secondary moment of inertia Ix of the pellicle frame having such a cross-sectional structure is expressed by the following equation similar to the pellicle frame having a cross section with a hollow portion.

$$Ix = \frac{BH^3 - bh^3}{12}$$

Therefore, the sectional secondary moment of inertia Ix of this pellicle frame was 4.08 mm$^4$.

Further, in this pellicle frame, a ventilation hole of φ 0.5 mm and four jig holes of φ 1.6 mm and 1.3 mm depth were formed. In addition, in this pellicle frame, the shape of the cross section at a position 5 mm from the center of the ventilation hole or that of the jig hole was like a letter I.

Next, after washing the thus prepared pellicle frame with pure water, a silicone adhesive (KE-101 A/B manufactured by Shin-Etsu Chemical Co., Ltd.) was applied to the upper end face of the pellicle frame, and an acrylic adhesive (SK Dyne 1495 manufactured by Soken Chemical & Engineering Co., Ltd.) was applied to the lower end face of the pellicle frame as the agglutinant layer.

Subsequently, a pellicle film made of monocrystalline silicon supported by a sheet of a meshed member was attached to the upper end face of the pellicle frame, and the pellicle film and the meshed member protruding outside of the pellicle frame were trimmed off, thereby completing the pellicle.

The thus manufactured pellicle was coupled with a 150-mm square photomask substrate in the same manner as in Example 1, and the PID was evaluated and it was 26 nm.

According to Table 1 above summarizing the foresaid results, it is confirmed from the comparison between Examples 1 through 6 and Comparative Examples 1 and 2 that when sectional secondary moment of inertia Ix of the pellicle frame is reduced, the PID also tends to decrease. Further, from the comparison between Example 2 and Comparative Example 1, it was also confirmed that when a hollow portion is formed at a corner portion of the pellicle frame, the sectional secondary moment of inertia Ix of the pellicle frame becomes smaller and the PID is effectively suppressed.

Further, from the comparison between Examples 1, 4 through 6 and Example 3, it was also confirmed that the PID is suppressed more effectively when the sectional secondary moment of inertia at a corner portion of the pellicle frame is smaller than that at a straight portion.

On the other hand, from the comparison between Example 1 and Comparative Example 3, it was also confirmed that for the purpose of suppressing the PID it is more effective to form a hollow portion in a corner portion than otherwise on account of the fact that by forming a hollow portion at a corner portion of a pellicle frame it is possible to reduce the PID value even when the sectional secondary moment of inertia at a corner portion of the pellicle frame in the case of Example 1 is larger than that in the case of Comparative Example 3.

EXPLANATION OF REFERENCE NUMERALS

1: pellicle frame
2: straight portion
3: corner portion
4: ventilation hole (through hole)
5: jig hole
6: hollow portion (formed inside a corner portion)
7: hollow portion (formed inside a straight portion)

What is claimed is:

1. A pellicle frame, comprising:
a frame body having a first surface and a second surface facing each other, and an inner surface and outer surface each of which connects the first surface and the second surface, each of the first surface and the second surface having a polygonal frame shape, the polygonal frame shape having straight portions and corner portions each connecting two adjacent straight portions among the straight portions,
wherein the frame body comprises a first hollow portion in at least one of the corner portions and a second hollow portion in at least one of the straight portions, the first hollow portion and the second hollow portion each having no opening at the first surface or the second surface, and
an area of a first cross section of the first hollow portion in the at least one of the corner portions is larger than an area of the second cross section of the second hollow portion in the at least one of the straight portions, provided that the first cross section and the second cross section are each perpendicular to a circumferential direction of the polygonal frame shape.

2. The pellicle frame as claimed in claim 1, wherein the first hollow portion and the second hollow portion communicate with each other.

3. The pellicle frame as claimed in claim 1, wherein the frame body has a through hole penetrating the frame body from the first hollow portion or the second hollow portion to the inner surface or the outer surface of the frame body.

4. The pellicle frame as claimed in claim 1, wherein the frame body comprises two sub-frames each having an attaching surface which has a polygonal frame shape and has a groove, the two sub-frames being joined together at the attaching surfaces of the two sub-frames such that at least one of the grooves forms the first hollow portion, the second hollow portion or both.

5. A pellicle frame as claimed in claim 4, wherein the two sub-frames are joined together by means of solid-phase joining.

6. A pellicle comprising:
a pellicle frame of claim 1; and
a pellicle film attached to the first surface of the frame body.

7. A pellicle frame as claimed in claim 3, wherein the frame body comprises two sub-frames each having an attaching surface which has a polygonal frame shape and has a groove, the two sub-frames being joined together at the attaching surfaces of the two sub-frames such that at least one of the grooves forms the first hollow portion, the second hollow portion, or both.

8. A pellicle, comprising:
a pellicle frame of claim 3; and
a pellicle film attached to the first surface of the frame body.

9. The pellicle frame as claimed in claim 2, wherein the frame body has a through hole penetrating the frame body from the first hollow portion or the second hollow portion to the inner surface or the outer surface of the frame body.

10. The pellicle frame as claimed in claim 2, wherein the frame body comprises two sub-frames each having an attaching surface which has a polygonal frame shape and has a groove, the two sub-frames being joined together at the attaching surfaces of the two sub-frames such that at least one of the grooves forms the first hollow portion, the second hollow portion, or both.

11. A pellicle frame as claimed in claim 10, wherein the two sub-frames are joined together by solid-phase joining.

12. A pellicle frame as claimed in claim 7, wherein the two sub-frames are joined together by solid-phase joining.

13. A pellicle, comprising:
a pellicle frame of claim 2; and
a pellicle film attached to the first surface of the frame body.

14. A pellicle, comprising:
a pellicle frame of claim 4; and
a pellicle film attached to the first surface of the frame body.

15. A pellicle, comprising:
a pellicle frame of claim 5; and
a pellicle film attached to the first surface of the frame body.

16. The pellicle frame as claimed in claim 1, wherein the frame body has a ventilation hole penetrating the frame body from the inner surface to the outer surface.

17. The pellicle frame as claimed in claim 2, wherein the frame body has a ventilation hole penetrating the frame body from the inner surface to the outer surface.

18. A pellicle frame, comprising:
a frame body having a polygonal frame shape, the polygonal frame shape having straight portions and corner portions connecting two adjacent straight portions among the straight portions,
wherein a sectional secondary moment of inertia at at least one of the corner portions of the frame body is smaller than a sectional secondary moment of inertia at the straight portions of the frame body.

19. A pellicle frame as claimed in claim 18, wherein the sectional secondary moment of inertia at the at least one of the corner portions of the frame body is 85% or greater but less than 100% of the secondary moment of inertia at the straight portions of the frame body.

20. A pellicle, comprising:
a pellicle frame of claim 18; and
a pellicle film attached to the frame body.

* * * * *